United States Patent
Hosono

(10) Patent No.: US 8,582,345 B2
(45) Date of Patent: *Nov. 12, 2013

(54) NONVOLATILE SEMICONDUCTOR MEMORY DEVICE

(75) Inventor: Koji Hosono, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 121 days.

This patent is subject to a terminal disclaimer.

(21) Appl. No.: 13/233,738

(22) Filed: Sep. 15, 2011

(65) Prior Publication Data

US 2012/0075912 A1    Mar. 29, 2012

(30) Foreign Application Priority Data

Sep. 24, 2010   (JP) ................................. 2010-213800

(51) Int. Cl.
   *G11C 11/00*   (2006.01)
(52) U.S. Cl.
   USPC .................. 365/148; 365/185.23; 365/189.15
(58) Field of Classification Search
   USPC .............. 365/148, 130, 163, 185.18, 185.23, 365/185.24, 189.047, 189.15, 189.16
   See application file for complete search history.

(56) References Cited

U.S. PATENT DOCUMENTS

| | | | | |
|---|---|---|---|---|
| 7,233,024 B2* | 6/2007 | Scheuerlein et al. | ............ | 257/74 |
| 7,663,132 B2* | 2/2010 | Toda et al. | ........................ | 257/3 |
| 7,948,790 B2* | 5/2011 | Tsukamoto et al. | ........... | 365/148 |
| 7,983,084 B2* | 7/2011 | Tokiwa et al. | ............ | 365/185.11 |
| 8,040,715 B2* | 10/2011 | Takase | ............ | 365/148 |
| 8,199,557 B2* | 6/2012 | Maejima et al. | .............. | 365/148 |
| 2008/0056041 A1 | 3/2008 | Liaw et al. | | |
| 2009/0003047 A1 | 1/2009 | Toda | | |
| 2009/0219750 A1* | 9/2009 | Tokiwa et al. | ................. | 365/148 |
| 2009/0224224 A1* | 9/2009 | Fujii et al. | ........................ | 257/2 |
| 2010/0008126 A1 | 1/2010 | Toda | | |
| 2010/0214820 A1 | 8/2010 | Hosono et al. | | |
| 2011/0032746 A1 | 2/2011 | Maejima et al. | | |
| 2011/0147691 A1* | 6/2011 | Yasutake | ........................ | 257/2 |
| 2011/0284816 A1* | 11/2011 | Fujii et al. | ........................ | 257/4 |

FOREIGN PATENT DOCUMENTS

JP    2010-61728    3/2010

* cited by examiner

*Primary Examiner* — Gene Auduong

(74) *Attorney, Agent, or Firm* — Oblon, Spivak, McClelland, Maier & Neustadt, L.L.P.

(57) ABSTRACT

A nonvolatile semiconductor memory device comprises a three-dimensional cell array block in which a plurality of cell array layers are stacked, each of the cell array layers including a plurality of first lines, a plurality of second lines configured to intersect the first lines, and a plurality of memory cells disposed at each of intersections of the first and second lines and each including a variable resistance element configured to store an electrically rewritable resistance value as data in a nonvolatile manner, and a reading control circuit for reading data from the memory cells under a condition set in respective groups to which one or more cell array layers having a common electric property of the memory cells belong.

20 Claims, 9 Drawing Sheets

NONVOLATILE SEMICONDUCTOR MEMORY DEVICE

CROSS-REFERENCE TO RELATED APPLICATIONS

This application is based upon and claims the benefit of priority from the prior Japanese Patent Application No. 2010-213800, filed on Sep. 24, 2010, the entire contents of which are incorporated herein by reference.

FIELD

Embodiments described herein relate generally to a nonvolatile semiconductor memory device.

BACKGROUND

Description of the Related Art

In recent years, for a successor candidate of a flash memory, attention is paid to a resistive random access memory device using variable resistive devices as memory devices. The resistive random access memory device includes a narrowly-defined resistive random access memory (ReRAM) that stores a resistance value state in a nonvolatile manner with a transition metal oxide as a recording layer, and a phase-change random access memory (PCRAM) that uses chalcogenide or the like as a recording layer to utilize resistance value information on a crystalline state (conductor) and a noncrystalline state (insulator).

A memory cell in the resistive random access memory device is known to have two kinds of operation modes. One is for switching the polarity of an applied voltage thereby to set a high resistance state or a low resistance state, which is called bipolar type. The other is for controlling a voltage value and a voltage applying time, without switching the polarity of an applied voltage, thereby to set a high resistance state or a low resistance state, which is called unipolar type.

The unipolar type is preferable for realizing a high-density memory cell array. This is because in the unipolar type, a cell array can be configured by stacking variable resistive devices and rectifier devices such as a diode at cross points between bit lines and word lines without using a transistor. Such memory cell arrays are three-dimensionally stacked so that a large capacity can be realized without increasing a cell array area.

In the unipolar type ReRAM, data is written into memory cells by applying a predetermined voltage to variable resistive devices for a short time. Thereby, the state of the variable resistive devices change from the high resistance state to the low resistance state. In the following, the operation of changing the state of the variable resistive devices from the high resistance state to the low resistance state is called setting operation. On the other hand, the data is erased from the memory cells by applying a lower predetermined voltage than the voltage for the setting operation to the variable resistive devices in the low resistance state for a long time after the setting operation. Thereby, the state of the variable resistive devices changes from the low resistance state to the high resistance state. In the following, the operation of changing the state of the variable resistive devices from the low resistance state to the high resistance state is called resetting operation. For example, when the high resistance state (reset state) is assumed as a stable state and in the case of binary data storage, the memory cell writes data by the setting operation of changing the reset state to the low resistance state.

The reading operation from the memory cells is performed by giving a predetermined voltage to the variable resistive devices and monitoring currents flowing through the variable resistive devices by a amplifier circuit. With the reading operation, a decision is made as to whether the variable resistive devices are in the low resistance state or in the high resistance state. In such semiconductor memory device, even when a multilayer structure in which an electric property of the memory cells in one cell array layer is different from an electric property of the memory cells in another cell array layer, data can be surely read from selected memory cells in each layer by the reading operation.

DETAILED DESCRIPTION

A nonvolatile semiconductor memory device according to embodiments has a three-dimensional cell array block in which a plurality of cell array layers are stacked, each of the cell array layers including a plurality of first lines, a plurality of second lines configured to intersect the first lines, and a plurality of memory cells disposed at each of intersections of the first and second lines and each including a variable resistance element configured to store an electrically rewritable resistance value as data in a nonvolatile manner, and a reading control circuit for reading data from the memory cells under a condition set in respective groups to which one or more cell array layers having a common electric property of the memory cells belong.

The nonvolatile semiconductor memory device according to the embodiments will be described below in detail with reference to the drawings. In the embodiments, a semiconductor memory device will be described as a resistive random access memory device using variable resistive devices as memory cells. However, the structure is merely exemplary, and of course the present invention is not limited thereto.

First Embodiment (Structure of Semiconductor Memory Device According to a First Embodiment)

Figure 1:
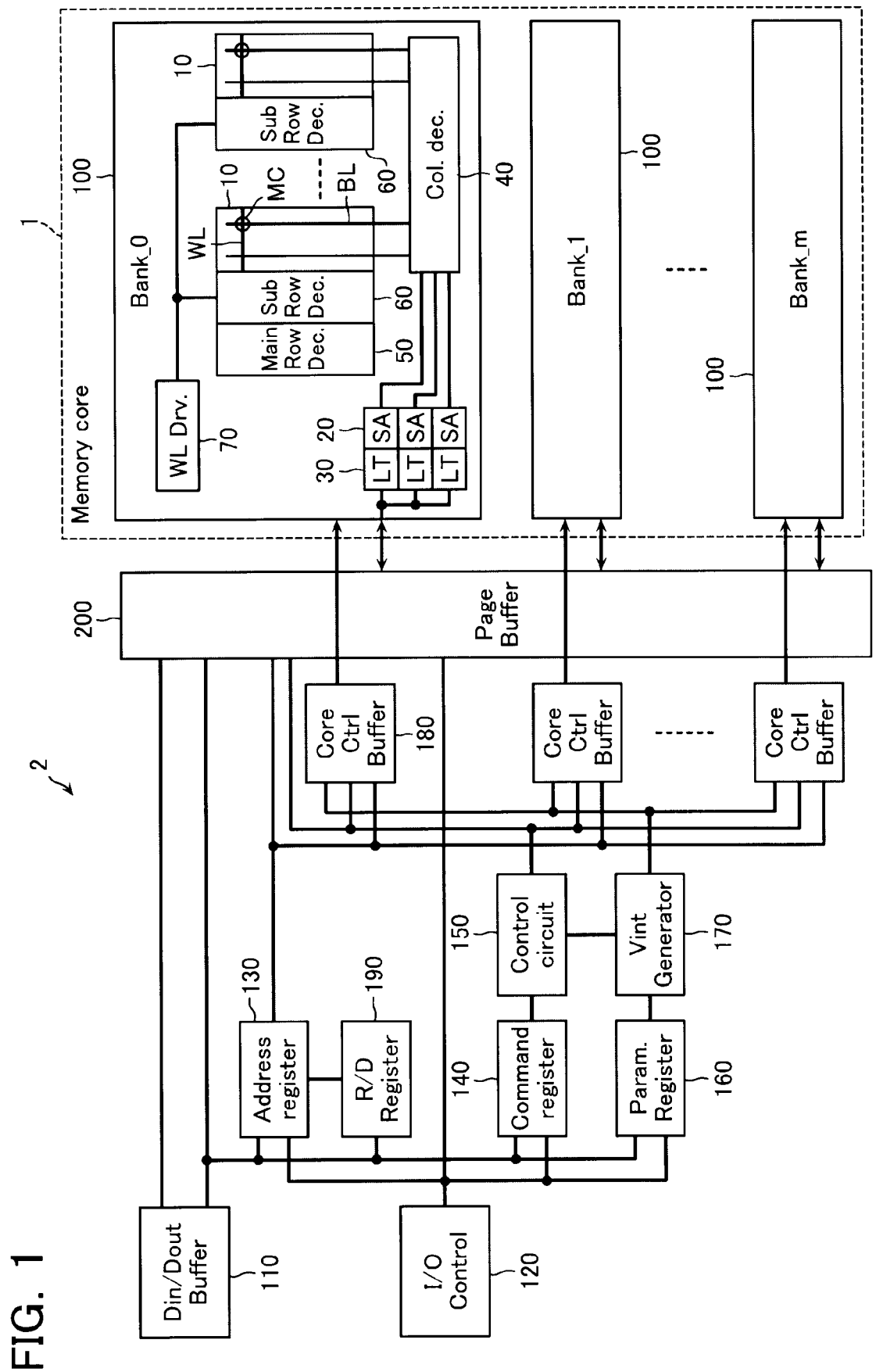
FIG. 1 is a block diagram showing a control circuit in a semiconductor memory device according to a first embodiment.

FIG. 1 is a block diagram showing a semiconductor memory device according to a first embodiment.

The semiconductor memory device has a memory core unit 1, and a peripheral circuit 2 for controlling data read/write on the memory core unit 1.

The memory core unit 1 is configured of a plurality of banks 100 (Bank_0 to Bank_m). Each bank 100 has a plurality of memory cell arrays 10. The memory cell arrays 10 are stacked to configure a three-dimensional cell array block. Each memory cell array 10 has a plurality of bit lines BL, a plurality of word lines WL perpendicular to the bit lines BL, and memory cells MC each connected between the bit line BL and the word line WL at the cross point therebetween. A column decoder 40 commonly provided in the memory cell arrays 10 in each bank 100 selects a bit line BL. The column decoder 40 selectively connects the bit line BL to a sense amplifier circuit 20 and a latch 30. The sense amplifier circuits 20 detect read data, and the latches 30 temporarily hold the read data and the written data. The sense amplifier circuit 20 and the latch 30 are shared between the memory cell arrays 10. The column decoder 40 comprises a column circuit unit formed of a decoder circuit for simultaneously selecting 16 bit lines BL, for example, and a bit line switch circuit.

The latch 30 is connected to a page buffer 200 in the peripheral circuit 2, and temporarily holds the read data or the written data exchanged between the sense amplifier circuit 20 and the page buffer 200 during the reading operation or the writing operation. The page buffer 200 is a data register capable of temporarily holding data for one page as a unit of data processing (such as 2 k bytes). When the page buffer 200 is configured to hold data for multiple pages, the page buffer 200 can function as a memory cache.

In each bank 100, the memory cell arrays 10 are configured such that a main row decoder 50 commonly provided therein and sub-row decoders 60 provided in each memory cell array 10 which select a word line WL. In other words, the row decoders have a hierarchy structure formed of the main row decoder 50 shared between the memory cell arrays 10 and the sub-row decoder 60 attached to each memory cell array 10. The row decoders in the hierarchy structure select a word line. A word line drive circuit 70 applies a predetermined selected word line voltage to selected word lines WL and a predetermined unselected word line voltage to unselected word lines WL, respectively.

The peripheral circuit 2 includes a data input/output buffer 110, an input/output control circuit 120, an address register 130, a command register 140, an operational control circuit 150, a parameter register 160, an internal voltage generator circuit 170, a core control buffer 180, a redundancy address register 190 and the page buffer 200.

The data I/O buffer 110 is connected to an I/O pad for inputting/outputting data in/from the semiconductor memory device. In the circuit structure shown in FIG. 1, there is shown a multiplex system in which all of commands, addresses and data for the operations of the semiconductor memory device are given from the I/O pad. For example, during the data writing, a data write command, an address indicating where the selected memory cell MC is, and data to be written are given via the data I/O buffer 110 to the semiconductor memory device. During the data reading, a data read command and a selected address are given to the semiconductor memory device. After the read data is stored based on the command and the address from the memory core unit 1 into the page buffer 200, the data is output to outside via the data I/O buffer 110.

The I/O control circuit 120 controls identification of data to be input/output in/from the I/O pad, or data output. Various control signals such as write enable signal, read enable signal, command latch enable signal and address latch enable signal are given to the I/O control circuit 120 from outside. The I/O control circuit 120 controls the input/output data based on a combination of states of the signals and a timing rule.

The I/O control circuit 120 recognizes the data input from the data I/O buffer 110 as a command during the command input, and stores the command in the command register 140. Similarly, the I/O control circuit 120 recognizes the input data as an address during the address input, and stores the address in the address register 130. The I/O control circuit 120 stores the input data in the page buffer 200 during the data input, and reversely the page buffer 200 enters the state in which the data can be output during the data output. The I/O control circuit 120 exchanges relief and replacement addresses required for the access control on a column redundancy cell or a row redundancy cell with the redundancy address register 190, or exchanges various control parameters such as voltage setting parameter with the parameter register 160. Though not shown, the I/O control circuit 120 may be configured to control the output control of a status indicating the operation state of the semiconductor memory device, or ID code output.

During the reading operation, a command is input to activate an internal control clock and simultaneously the operational control circuit 150 starts the operation. The internal voltage control circuit 170 for generating internal voltages according to various operations is also activated. During the reading operation, the operational control circuit 150 outputs timing signals for controlling charge/discharge of the word lines WL or the bit lines BL, or a precharge or sense operation of the sense amplifier 20 to the core control buffer 180 such that a desired reading operation is performed in the memory core unit 1. The internal voltage control circuit 170 also supplies a predetermined voltage to the memory core unit 1 and the core control buffer 180.

Since the core control buffers 180 are provided in the banks Bank_0 to Bank_m respectively, the banks 100 to be simultaneously operated can be freely controlled. For example, when the data processing speed is increased for the reading operation or the writing operation, the number of banks 100 to be simultaneously activated may be increased. Since a consumed current remarkably increases depending on an operation, the number of banks 100 to be simultaneously activated can be increased or decreased.

Figure 2:
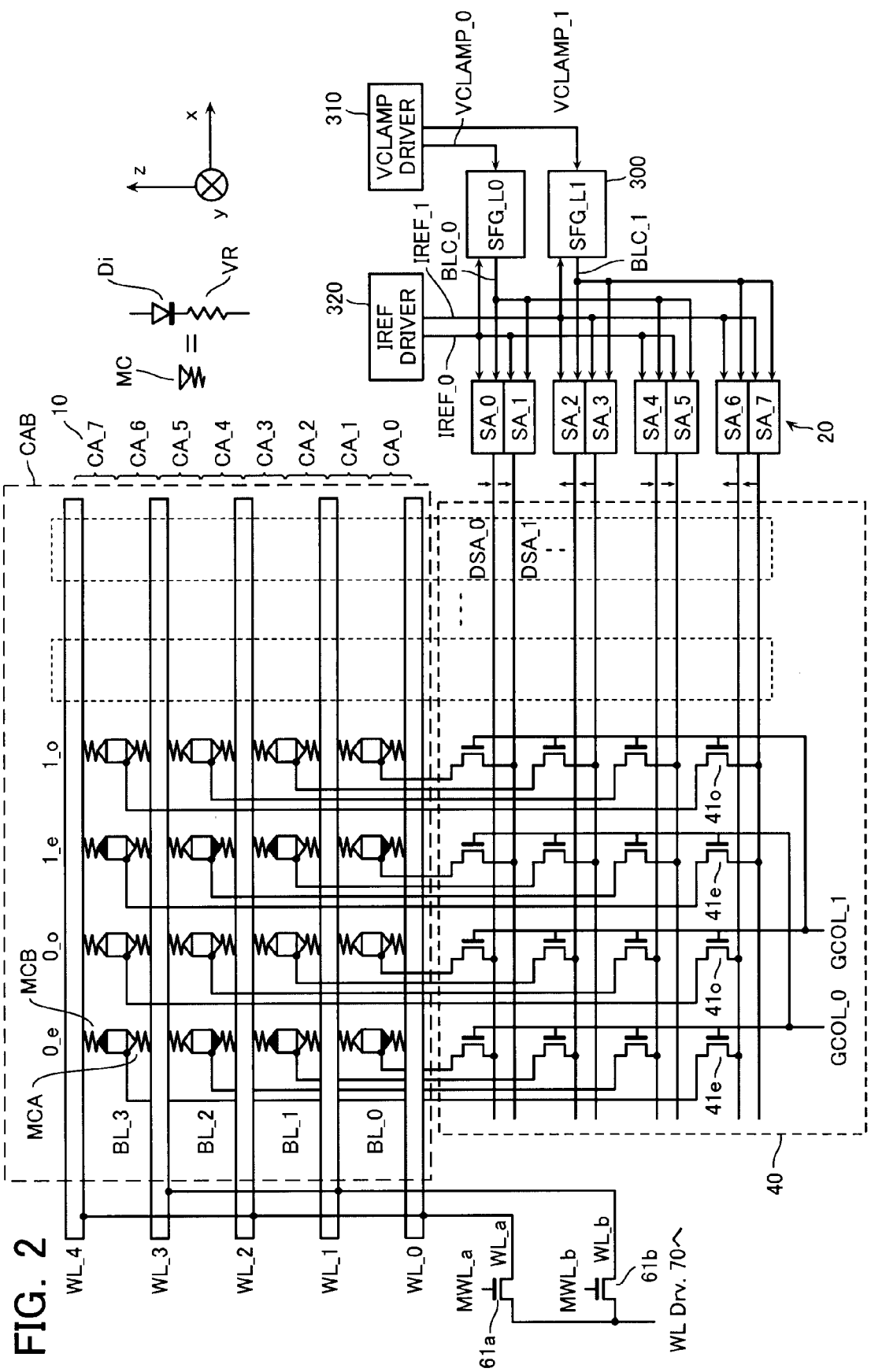
FIG. 2 is a circuit diagram showing a bank configuring a memory core unit in the semiconductor memory device according to the first embodiment.

FIG. 2 is a diagram showing part of each bank 100 configuring the memory core unit 1 in the semiconductor memory device according to the present embodiment. The memory core unit 1 includes a three-dimensional cell array block CAB and its peripheral reading control circuit. In the present embodiment, an exemplary resistive random access memory device of unipolar type is shown. In the resistive random access memory device of unipolar type, as shown in FIG. 2, a resistive random access unit memory cell MC in which a rectifier device such as a diode Di and a variable resistive device VR are connected in series is arranged at each cross point between the bit line BL and the word line WL.

The variable resistive device VR has a electrode/transition metal oxide/electrode structure, for example, and causes a change in resistance value of the metal oxide depending on an application condition such as voltage, current or heat, thereby storing different states of the resistance value as information in a nonvolatile manner. The variable resistive device VR may specifically employ PCRAM such as chalcogenide for changing a resistance value due to a phase transition between the crystalline state and the noncrystalline state, conductive bridging RAM (CBRAM) for forming a contacting bridge between electrodes by precipitating metal cation, or changing a resistance value by ionizing the precipitated metal and breaking the contacting bridge, or ReRAM for changing a resistance value by applying a voltage or current (which is largely divided into one for changing a resistance due to the presence of charges trapped in a charge trap present on the electrode interface and one for changing a resistance due to the presence of a conductive path caused by loss of oxygen).

When the memory cell MC is a unipolar type ReRAM, the data is written into the memory cell MC by applying a voltage of 3.5 V (actually about 4.5 V including a reduced voltage of the diode Di) and a current of about 10 nA to the variable resistive device VR for about 10 ns to 100 ns. Thereby, the variable resistive device VR changes from the high resistance state to the low resistance state (setting operation).

On the other hand, the data is erased from the memory cell MC by applying a voltage of 0.8 V (actually about 1.8 V including a reduced voltage of the diode Di) and a current of about 1 µA to 10 µA to the variable resistive device VR in the low resistance state for about 500 ns to 2 µs after the setting operation. Thereby, the variable resistive device VR changes from the low resistance state to the high resistance state (resetting operation).

The reading operation from the memory cell MC is performed by giving a voltage of 0.4 V (actually about 1.4 V including a reduced voltage of the diode Di) to the variable resistive device VR and monitoring a current flowing through the variable resistive device VR by the sense amplifier 20. Thereby, a decision is made as to whether the variable resistive device VR is in the low resistance state or in the high resistance state. The reading operation will be described in detail in the following embodiments.

By way of example, a signal line leading to the anode side of the diode Di is assumed as the bit line BL and a signal line leading to the cathode side is assumed as the word line WL but the connection polarity is not limited thereto. The memory cell MC in which the diode Di and the variable resistive device VR are connected in series is denoted with the illustrated symbol. This is applicable to the following examples. The arrangement and the polarity of the diode Di and the variable resistive device VR configuring the memory cell MC are not limited to the illustrated ones. The memory cell array 10 shown in FIG. 2 is configured such that 4000 memory cells MC are arranged in the longitudinal direction of the bit line BL (in the y direction in FIG. 2, that is, in the direction from the front to the back on the figure) and 1000 memory cell MC is arranged in the longitudinal direction of the word line WL (in the x direction in FIG. 2), for example. A three-dimensional cell array block CAB is configured such that the memory cell arrays 10 are stacked as the cell array layers CA_0 to CA_7 in the direction orthogonal to the bit line BL and the word line WL (in the z direction in the Figure). In the embodiment, the bit line BL_i/2 or the word line WL_(i+1)/2 is shared between the adjacent memory cell array layers CA_i and CA_i+1. In this way, since the bit lines BL and the word lines WL are alternately arranged, the diodes Di of the memory cell MC connected to the common word lines WL are formed to reversely flow a current each other.

When manufacturing the semiconductor memory device according to the present embodiment configured as above, for example, the layers are stacked such that the forward bias direction of the diode Di is reversed alternately. In the memory cell MC manufactured in this way, a manufacture condition is different between the structure in which the current flows downward (in the −z axis direction in FIG. 2) and the structure in which the current flows upward (in the +z axis direction in FIG. 2), which causes a difference in electric property. In order to group the cell array layers CA_i having the same electric property, for example, the cell array layers CA_0, CA_2, CA_4 and CA_6 in which the current flows downward are classified into group A and the cell array layers CA_1, CA_3, CA_5 and CA_7 in which the current flows upward are classified into group B. The memory cells belonging to the group A are called MCA and the memory cells belonging to the group B are called MCB.

The even-numbered word lines WL_0, WL_2, WL_4 and the odd-numbered word lines WL_1, WL_3 are commonly connected to the wiring WL_a and the WL_b, respectively, and either one of the wirings WL_a and WL_b is selected by the word line select switch 61a, 61b to be connected to the word line drive circuit 70. The word line select switches 61a, 61b are driven by the main word line signals MWL_a and MWL_b output from the main row decoder 50 for decoding the row address, respectively.

The bit line BL is connected to the sense amplifier circuit 20 via the bit line select switches 41e, 41o driven by the column decoder 40. The sense amplifier circuits 20 are provided as many as the number of layers of the bit lines BL multiplied by the number of columns to be simultaneously selected. In the illustrated example, for four bit lines BL_0 to BL_3 and two columns to be simultaneously selected, eight sense amplifier circuits SA_0 to SA_7 are provided. The sense amplifier circuits SA_0 to SA_7 are connected to the bit lines BL_0 to BL_3 of the even numbered columns 0_e and 1_e via the bit line select switch 41e for eight even-numbered columns and are connected to the bit lines BL_0 to BL_3 of the odd-numbered columns 0_o and 1_o via the bit line select switch 41o for eight odd-numbered columns. The bit line select switch 41e for the even-numbered columns and the bit line select transistor 41o for the odd-numbered columns are alternately driven by the column control signals GCOL_0 and GCOL_1, respectively.

For the sense amplifiers 20, SA_0, SA_1, SA_4 and SA_5 configure one group and SA_2, SA_3, SA_6 and SA_7 configure the other group. The former is input a reference current IREF_0 from a reference current generator 320 and is supplied with a bit line clamp voltage BL_0 from SFG_L0 in a bit line voltage control circuit 300 and the latter is input a reference current IREF_1 from the reference current generator 320 and is supplied with a bit line clamp voltage BL_1 from SFG_L1 in the bit line voltage control circuit 300. The bit line voltage control circuit 300 is supplied with clamp voltages VCLAMP_0 and VCLAMP_1 from a clamp voltage generator 310, respectively.

(Operations of Semiconductor Memory Device According to the First Embodiment)

The reading operation in the semiconductor memory device configured as above will be described below.

In the embodiment, when the word lines WL_0, WL_2 and WL_4 are selected as shown in FIG. 2, the cell array layers CA_0, CA_4 belonging to the group A and the cell array layers CA_3, CA_7 belonging to the group B are to be simultaneously accessed. When the word lines WL_1 and WL_3 are selected, the cell array layers CA_2, CA_6 belonging to the group A and the cell array layers CA_1, CA_5 belonging to the group B are to be simultaneously accessed. For the cell array layers, the even-numbered word lines WL and the odd-numbered word lines WL are alternately selected. The memory cells MC in black in the Figure indicate a combination of memory cells MC simultaneously selected at certain timing.

Then, the reading operation in a comparative example will be described with reference to FIGS. 3 to 5 before describing the reading operation in this embodiment.

Figure 3:
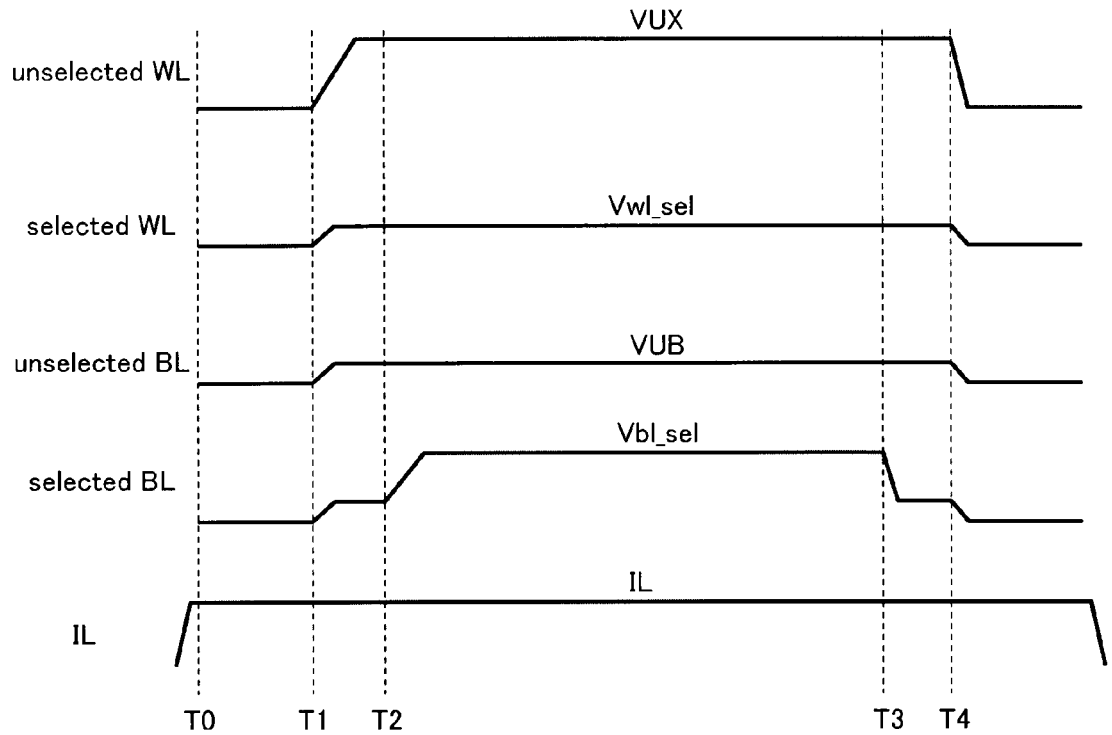
FIG. 3 is a timing chart showing a reading operation by a semiconductor memory device according to a comparative example.
Figure 4:
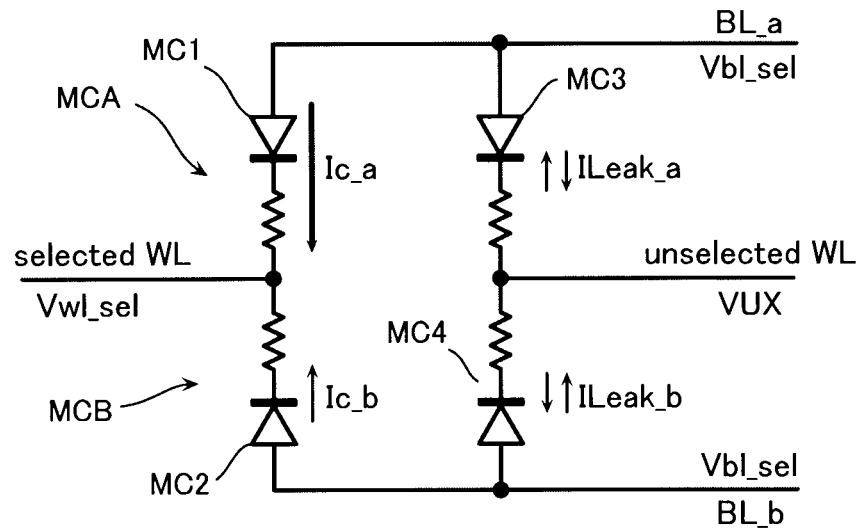
FIG. 4 is an equivalent circuit diagram showing a memory cell array during the reading operation in a nonvolatile semiconductor memory device according to the comparative example.

When the data is read from the selected memory cell MC, as shown in FIG. 3, for example, an unselected word line voltage VUX of about 1.5 V is applied to the unselected word line WL in the memory cell array 10, a selected word line voltage Vwl_sel of about 0.5 V is applied to the selected word line WL, and an unselected bit line voltage VUB of about 0.5 V is applied to the unselected bit line BL. In this state, a selected bit line voltage Vbl_sel of about 1.5 V is applied to the selected bit line BL. Thereby, as shown in FIG. 4, for example, leak currents ILeak_a and ILeak_b resulted from a difference between the selected bit line voltage Vbl_sel and the unselected word line voltage VUX flow through the unselected memory cells MC3 and MC4 connected to the selected bit line BL and cell currents Ic_a and Ic_b depending on the resistance value of the variable resistive device VR flow through the simultaneously selected memory cells MC1 and MC2. The memory cells MC1 and MC2 are the memory cell MCA belonging to the group A and the memory cell MCB belonging to the group B, respectively, and thus are different in the electric property from each other. For example, when a current more easily flows in the memory cell MCA than in the memory cell MCB, even when both are in the set state, the current Ic_a flowing through the memory cell MCA is larger than the current Ic_b flowing through the memory cell MCB.

Figure 5:
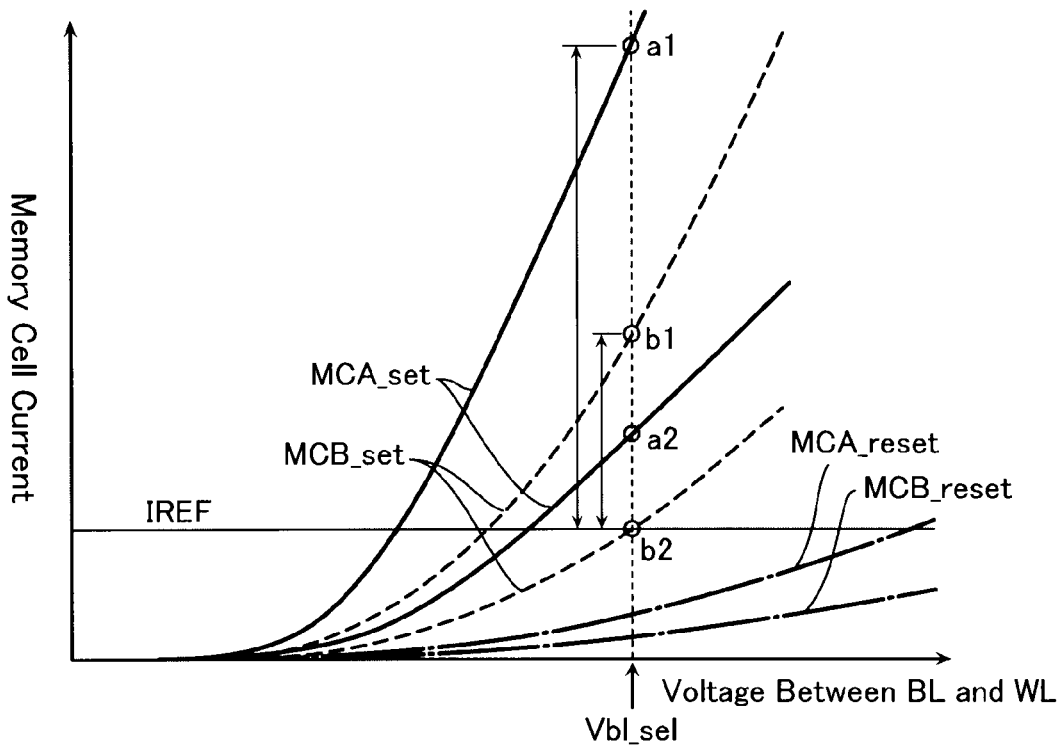
FIG. 5 is a graph showing a current/voltage property of memory cells in the nonvolatile semiconductor memory device according to the comparative example.

This is shown in FIG. 5. With the horizontal axis indicating a voltage between the bit line BL and the word line WL and the vertical axis indicating a cell current, the solid line curves indicate the minimum value and the maximum value of the voltage/current property in the set state of the memory cell MCA and the dotted line curves indicate the minimum value and the maximum value of the voltage/current property in the set state of the memory cell MCB. The chain lines indicate the voltage/current property in the reset state of the memory cells MCA and MCB, respectively. A decision can be made as to whether the memory cell MC is in the set state or in the reset state depending on whether a current larger than the reference current IREF flows when the bit line voltage Vbl_sel is applied to the bit line BL. However, when the same bit line voltage Vbl_sel is applied to the bit lines BL connected to both the memory cells MCA and MCB, as shown in FIG. 5, the cell current varies between a1 and a2 in the memory cell MCA and varies between b1 and b2 in the memory cell MCB. Therefore, in the memory cell MCA in which the largest cell current a1 flows, there may occur erroneous writing causing a change in the cell state due to excessive current. In the memory cell MCB in which the smallest current b2 flows, there may occur erroneous reading due to a set value of the reference current IREF.

In the embodiment, the reading operation is performed for preventing such a variation in the current value. The reading operation according to the embodiment will be described with reference to FIGS. 6 to 8.

Figure 6:
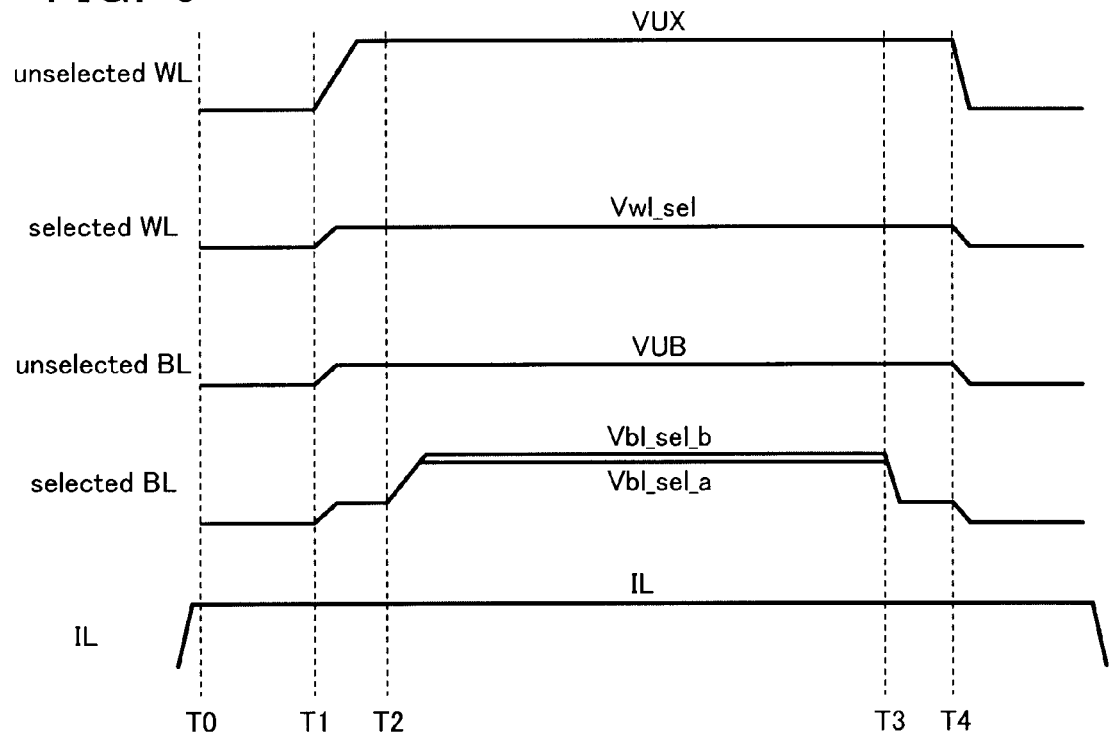
FIG. 6 is a timing chart showing a reading operation by the semiconductor memory device according to the first embodiment.

In the present embodiment, as shown in FIG. 6, the selected bit line voltage (reading level voltage) Vbl_sel_a applied to the bit line BL connected to the memory cell MCA is different from the selected bit line voltage (reading level voltage) Vbl_sel_b applied to the bit line BL connected to the memory cell MCB. For simplified description, the illustrated example shows that the selected bit line voltages Vbl_sel_a and Vbl_sel_b are selected for one column while the unselected word line voltage VUX and the selected word line voltage Vwl_sel are being applied, but actually, while the unselected word line voltage VUX and the selected word line voltage Vwl_sel are being applied, the selected bit lines BL are sequentially switched and the selected bit line voltages Vbl_sel_a and Vbl_sel_b are sequentially applied to the switched selected bit lines BL.

Figure 7:
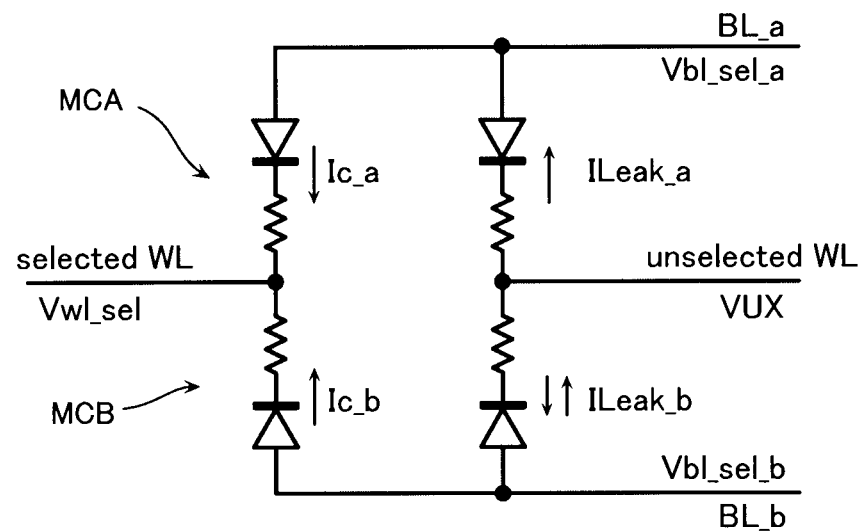
FIG. 7 is an equivalent circuit diagram showing a memory cell array during the reading operation in the nonvolatile semiconductor memory device according to the first embodiment.
Figure 8:
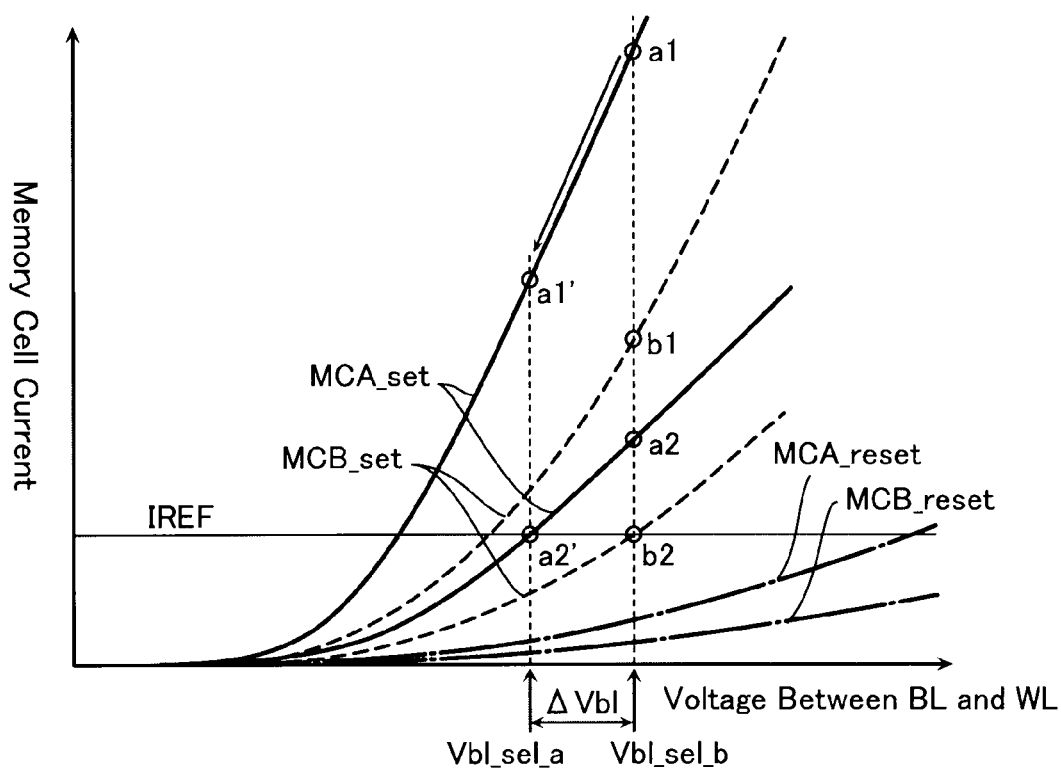
FIG. 8 is a graph showing a current/voltage property of the memory cells in the nonvolatile semiconductor memory device according to the first embodiment.

With the voltage applying method, as shown in FIG. 7, the cell currents Ic_a and Ic_b flowing through the selected memory cells MCA and MCB are made substantially equal. This is shown in FIG. 8. The voltage between the bit line and the word line to be applied to the memory cell MCA is set at the voltage Vbl_sel_a smaller than the voltage Vbl_sel_b by ΔVbl so that the cell current can be reduced from the range between a1 to a2 to the range between a1' to a2', consequently reducing the variation in the cell current in the memory cells MCA and MCB.

The currents IL shown in FIGS. 3 and 6 are the reference current as the mirrored reference current IREF described later, and are identical. In the example of FIG. 2, the cell current is decided by selecting two kinds of reference currents IREF_0 and IREF_1 for the reference current, but may be decided by one kind.

(Exemplary Specific Circuits Around Sense Amplifier Circuits of Semiconductor Memory Device According to the First Embodiment)

The circuits around the sense amplifier circuits for generating the selected bit line voltages Vbl_sel_a and Vbl_sel_b will be detailed with reference to FIG. 9.

Figure 9:
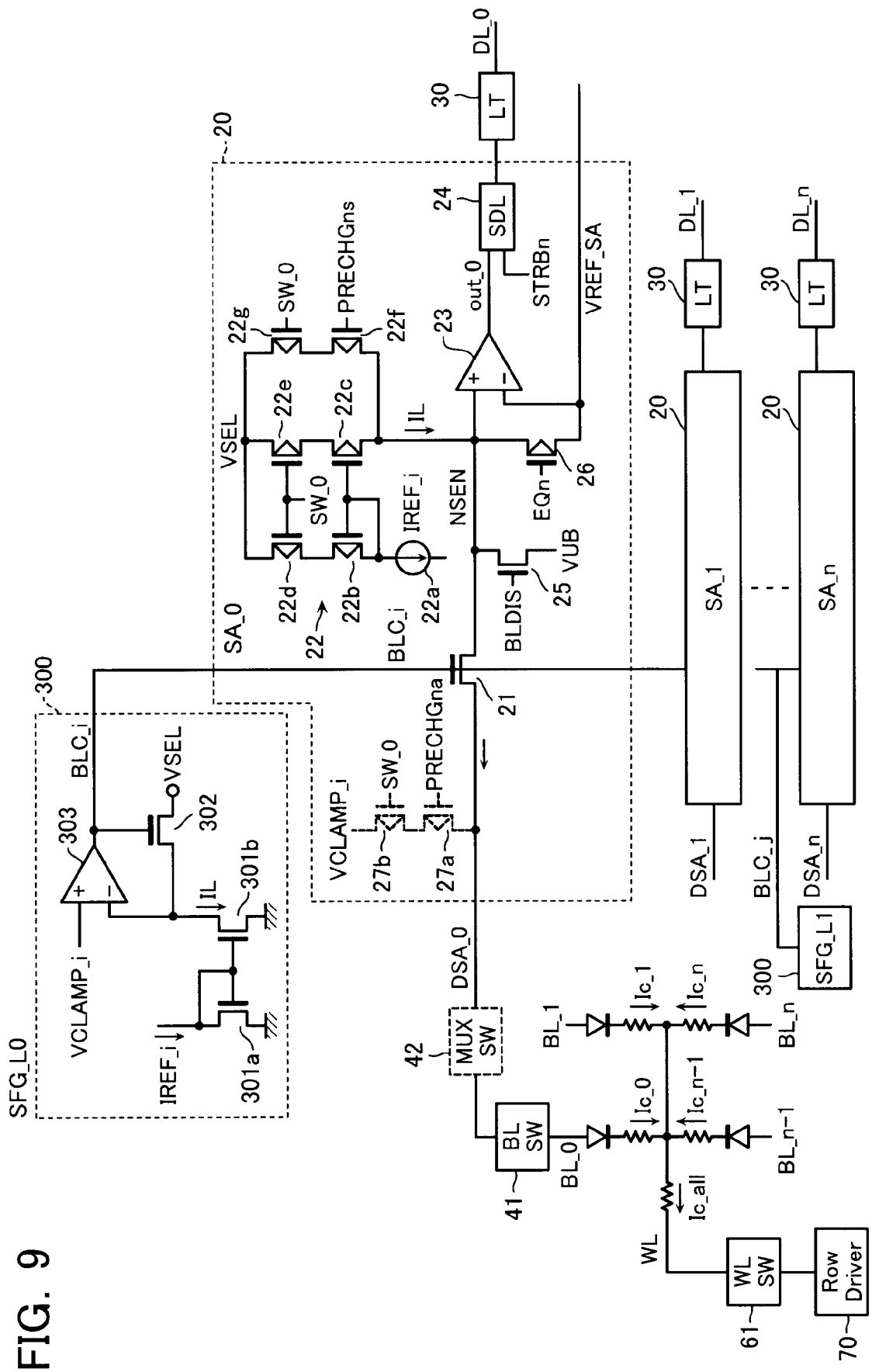
FIG. 9 is a circuit diagram showing the control circuit in the semiconductor memory device according to the first embodiment.

As shown in FIG. 9, the bit line voltage control circuit 300 has a differential amplifier 303 for inputting the clamp voltage VCLAMP_i supplied from the clamp voltage generator 310 into a non-inverting input terminal. The non-inverting input terminal of the differential amplifier 303 is input a voltage of an output terminal of the reference current IF of the current mirror formed of the transistors 301a and 301b with the reference current IREF_i as input and the reference current IL as output. The output terminal of the differential amplifier 303 is connected to the gate of the transistor 302, the source of the transistor 302 is connected to the non-inverting input terminal of the differential amplifier 303, and VSEL is applied to the drain of the transistor 302. On the other hand, since the output voltage BLC_i of the differential amplifier 303 is also supplied to the gate of a clamp transistor 21 of the sense amplifier SA_0, the clamp transistor 21 outputs the output voltage DSA_0 such that the voltage at the bit line BL side is restricted to the clamp voltage VCLAMP_i while the reference current IL is flowing to the bit line BL side. When the clamp voltage VCLAMP_i supplied from the clamp voltage generator 310 is the clamp voltage VCLAMP_0, the output voltage DSA_0 is the selected bit line voltage Vbl_sel_a. On the other hand, the clamp voltage VCLAMP_i is changed to the clamp voltage VCLAMP_1 so that the selected bit line voltage is changed to Vbl_sel_b.

The outputs DSA_0 to DSA_n from the sense amplifiers SA_0 to SA_n are connected to the selected bit lines BL via the bit line switch 41, respectively. A multiplexer 42 may be provided between the bit line switch 41 and the sense amplifier 20. The multiplexer 42 may be introduced in an appropriate form according to the circuit configuration. For example, when the number of bit lines BL simultaneously selected by the column decoder 40 is larger than the number of sense amplifier circuits 20, a group of bit lines connected to the sense amplifier circuits 20 needs to be selected. In this case, the multiplexer 42 is required.

The sense amplifier circuit 20 includes the clamp transistor 21, a current mirror circuit 22, a differential amplifier 23, a sense data latch 24, a discharge transistor 25 and an equalize transistor 26. The clamp transistor 21 is connected to the signal line DSA at one end and is connected to the non-inverting input terminal (sense node NSEN) of the differential amplifier 23 at the other end. The inverting input terminal of the differential amplifier 23 is supplied with the reference voltage VREF_SA for data decision. The equalize transistor 26 is connected between the sense node NSEN and the inverting input terminal of the differential amplifier 23. The equalize transistor 26 is conducted when the signal EQn is in the "L" state to equalize the voltage of the sense node NSEN with the reference voltage VREF_SA. A reference voltage drive circuit 181 for outputting the reference voltage VREF_SA is contained in a core control buffer 180 shown in FIG. 1, for example.

The discharge transistor 25 is connected between the signal line DSA and the VUB terminal (the terminal to which 0 V to the forward direction voltage Vf (about 0.6 V at most) of the diode is applied). The discharge transistor 25 has a function of discharging the signal line DSA to the potential VUB (or ground potential) of the VUB terminal when the short-circuited signal BLDIS is input at the gate. For assisting the bit line precharge, PMOS transistors 27a and 27b shown in a dashed line in FIG. 9 may be added. The transistors 27a and 27b charge the bit line BL to the voltage VCLAMP_i when the signals PRECHGna and SW_0 are in the "L" state.

The sense node NSEN is connected with the current mirror circuit 22 formed of the current source circuit 22a and the PMOS transistors 22b, 22c, 22d, 22e. A predetermined voltage sufficiently higher than the setting level of the bit line BL is applied to the VSEL connected as the power supply of the current mirror. The current mirror circuit 22 is supplied with the reference current IREF_i by the current source circuit 22a. When the signal SW_0 and the signal PRECHGns are in the "L" state, the current mirror circuit 22 flows a predetermined current to the sense node NSEN. The current mirror circuit 22 flows the reference current IL for reading to the sense node NSEN during the reading operation.

The basic operations of the sense amplifier circuit 20 are as follows. While the voltage of the bit line BL is being clamped by the clamp transistor 21, the cell current Ic_0 flows through the selected memory cell MC_0. The reference current IL flows into the sense node NSEN from the current mirror circuit 22. A change in voltage of the sense node NSEN due to a difference between the cell current Ic_0 and the reference current IL is detected by the differential amplifier 23.

The output signal out_0 of the differential amplifier 23 is latched by the sense data latch 24. The sense data latch 24 latches the output signal out_0 of the differential amplifier 23 based on the signal STRBn. When the reading operation is finished, the data held in the sense data latch 24 is sent as the output signal of the sense amplifier 20 to the latch 30. The data in the latch 30 is output to outside via the page buffer 200.

According to the method of the present embodiment, since the voltage can be applied depending on the resistance value of the memory cell MC, the data can be prevented from being rewritten or disturbed during the reading operation.

Second Embodiment (Structure of Semiconductor Memory Device According to a Second Embodiment)

Figure 10:
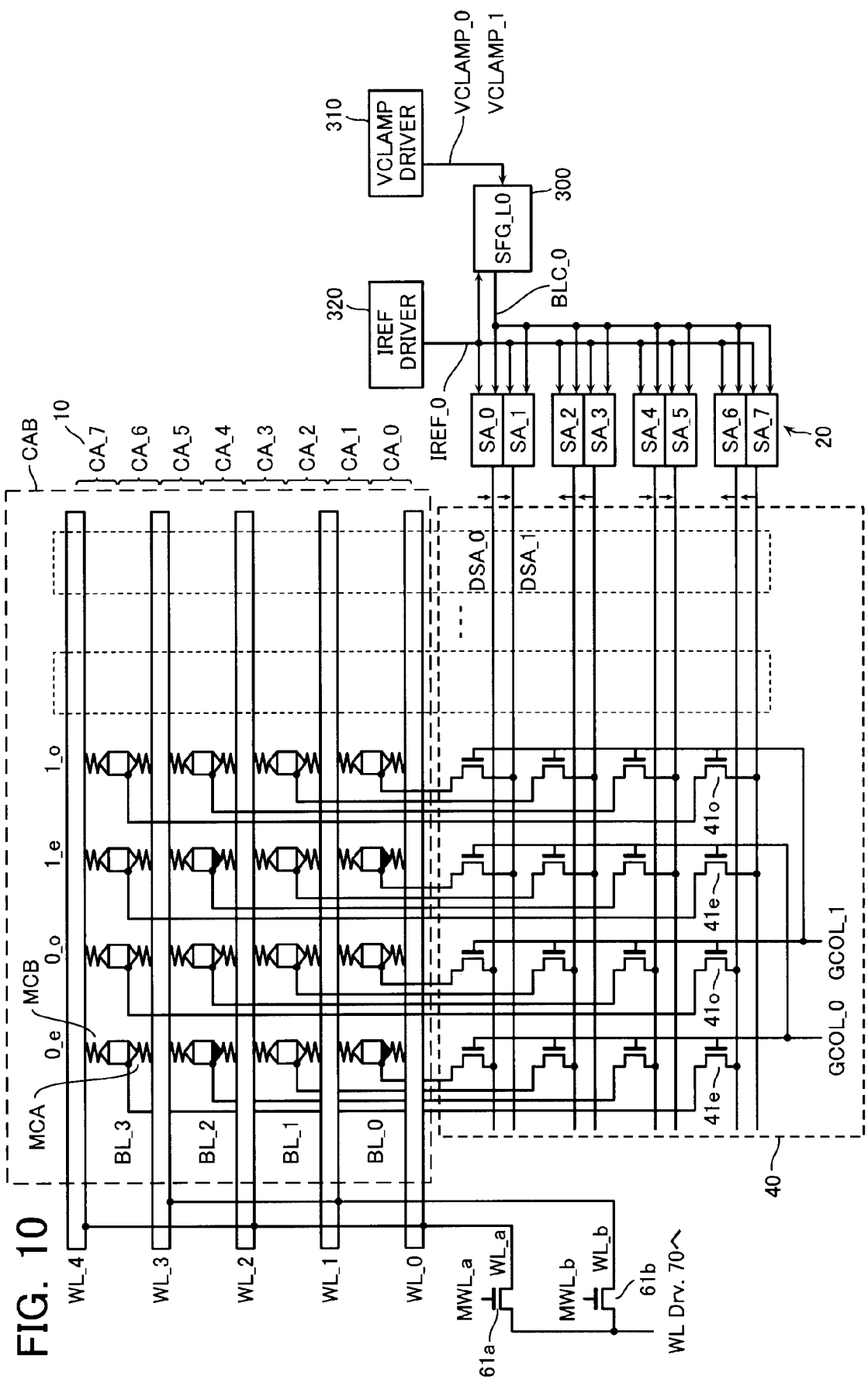
FIG. 10 is a circuit diagram showing a bank configuring a memory core unit in a semiconductor memory device according to a second embodiment.

FIG. 10 is a block diagram showing a memory bank of a semiconductor memory device according to a second embodiment.

The memory bank according to the second embodiment is different from the previous embodiment in that the memory cells MCA belonging to the group A and the memory cells MCB belonging to the group B are selected at a different timing. In the embodiment, only one bit line voltage control circuit 300 is provided.

(Operations of Semiconductor Memory Device According to the Second Embodiment)

As shown in FIG. 7, assuming that the selected bit line voltage Vbl_sel_a applied to the bit line BL_a connected to the memory cell MCA is lower than the voltage Vbl_sel_b applied to the bit line BL_b connected to the memory cell MCB, the cell currents flowing through the selected memory cells MCA and MCB change to be less varied. On the other hand, there may be assumed that a potential difference between the unselected word line voltage VUX and the selected bit line voltage Vbl_sel_a increases, a reverse bias voltage to be applied to the unselected memory cell MCA increases and a reverse leak current ILeak_a increases.

In the embodiment, the timing of the reading operation from the memory cell MCA belonging to the group A is offset from the timing of the reading operation from the memory cell MCB belonging to the group B so that the different unselected word line voltages VUX_0 and VUX_1 are applied at a different reading timing.

In other words, in FIG. 10, when the word lines WL_0, WL_2 and WL_4 are the selected word lines, first the cell array layers CA_0 and CA_4 belonging to the group A are to be simultaneously accessed and then the cell array layers CA_3 and CA_7 belonging to the group B are to be simultaneously accessed. When the word lines WL_1 and WL_3 are the selected word lines, first the cell array layers CA_2 and CA_6 belonging to the group A are to be simultaneously accessed and then the cell array layers CA_1 and CA_5 belonging to the group B are to be simultaneously accessed. For the cell array layers, the even-numbered columns and the odd-numbered columns are alternately selected. The memory cells MC in black in the Figure indicate a combination of memory cells MC simultaneously selected at certain timing.

Figure 11:
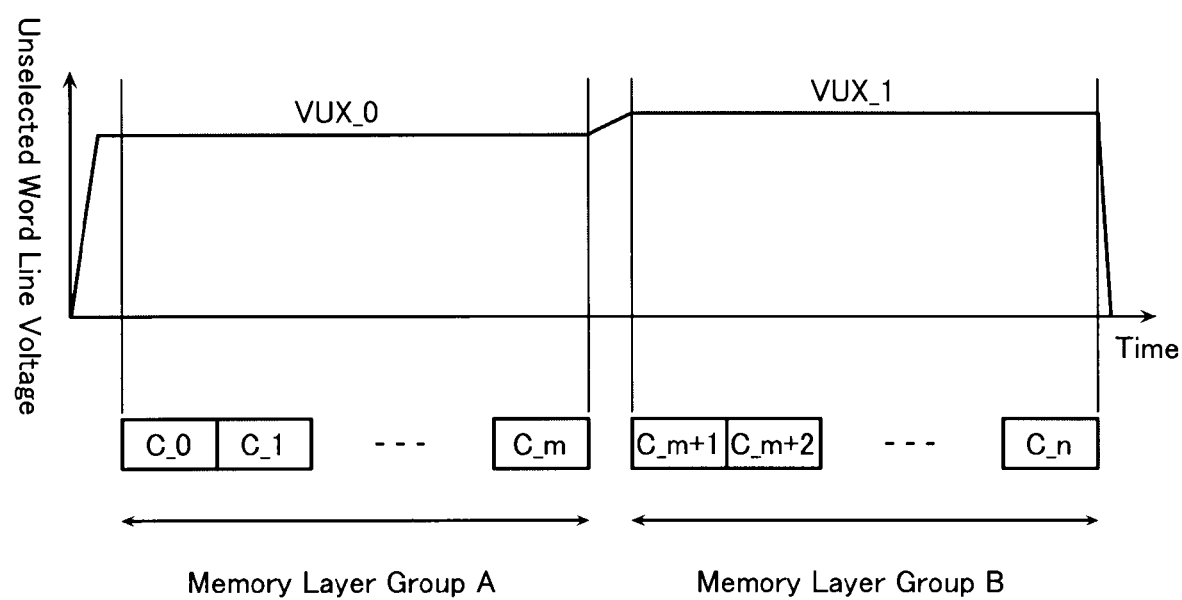
FIG. 11 is a diagram showing an applied voltage and an applying timing on unselected word lines during a reading operation by a nonvolatile semiconductor memory device according to the second embodiment.

FIG. 11 is a diagram showing an applied voltage and an applying timing on unselected word lines during a reading operation by a nonvolatile semiconductor memory device according to this embodiment. When the memory cells MCA in the group A are read, the unselected word line voltage is set at VUX_0 and the clamp voltage is set at VCLAMP_0 so that the column addresses are sequentially updated and the bit lines BL are sequentially selected. Thereby, the selected bit line voltage Vbl_sel_a is sequentially applied to the selected bit line BL_a. When the reading of the memory cell MCA in the group A is finished, the unselected word line voltage is switched to VUX_1 and the clamp voltage is switched to VCLAMP_1 to sequentially update the column addresses and to sequentially select the bit lines BL. Thereby, the memory cell arrays MCB in the group B are read.

The present embodiment is lower in the reading speed than the previous embodiment but can select the unselected word line voltage VUX suitable for the memory cell layers, thereby reducing the reverse leak current ILeak.

Third Embodiment (Structure of Semiconductor Memory Device According to a Third Embodiment)

Figure 12:
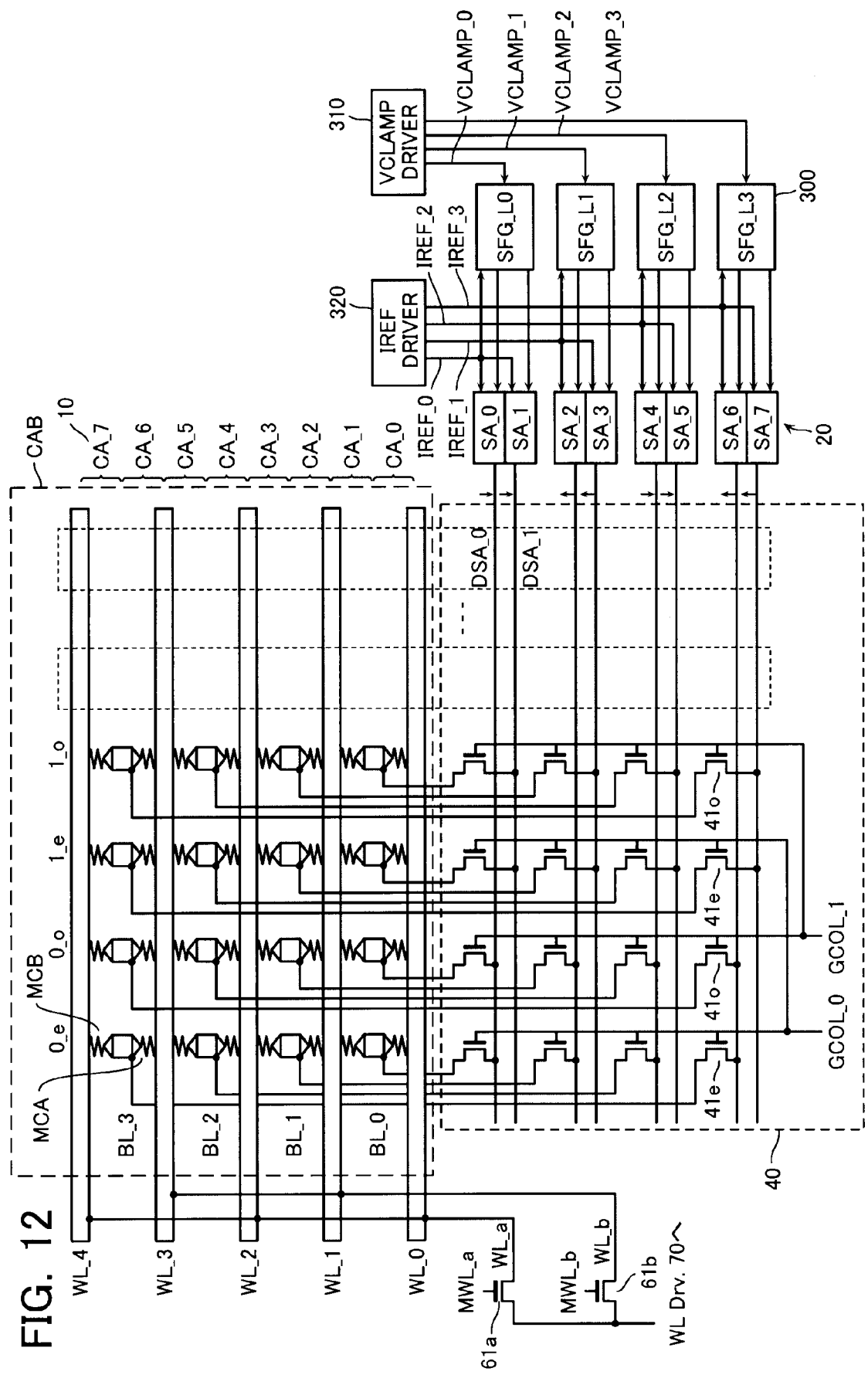
FIG. 12 is a circuit diagram showing a bank configuring a memory core unit in a semiconductor memory device according to a third embodiment.

FIG. 12 is a block diagram showing a memory bank of a semiconductor memory device according to a third embodiment. The present embodiment is the same as FIG. 2 in the basic structure but is different therefrom in that the different reference currents IREF_0 to IREF_3 are supplied from the reference current generator 320 to SA_0 and SA_1, SA_2 and SA_3, SA_4 and SA_5, and SA_6 and SA_7 in the sense amplifier circuits 20 and the different voltages are supplied from the voltage control circuit 300 thereto.

The structure is versatile for selecting the memory cells MC. In the first and second embodiments, the memory cells MC are divided into the group A and the group B depending on the cell array layer, but in the present embodiment, the memory cells MC of each cell array layer can be grouped in respective cell array layers. Thereby, in the step of manufacturing the memory cell arrays 10, even when the electric properties of the memory cells in one cell array layer are different from the electric properties of the memory cells in other cell array layers, the stable reading operation can be performed.

Others

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
    a three-dimensional cell array block in which a plurality of cell array layers are stacked, each of the cell array layers including a plurality of first lines, a plurality of second lines configured to intersect the first lines, and a plurality of memory cells disposed at each of intersections of the first and second lines and each including a variable resistance element configured to store an electrically rewritable resistance value as data in a nonvolatile manner; and
    a reading control circuit for reading data from the memory cells under a condition set in respective groups to which one or more cell array layers having a common electric property of the memory cells belong.

2. The nonvolatile semiconductor memory device according to claim 1, wherein the reading control circuit comprises:
    a reading level control circuit for, when reading data from the memory cells, supplying a reading level voltage set in respective groups to at least one of the first and second lines.

3. The nonvolatile semiconductor memory device according to claim 1 further including non-ohmic devices, wherein the three-dimensional cell array block is formed such that the first lines or the second lines are shared and forward bias directions of the non-ohmic devices are reversed between adjacent cell array layers in the stacked direction, and
    the reading control circuit reads data from plurality of memory cells having the non-ohmic devices having the common forward bias direction as the same group.

4. The nonvolatile semiconductor memory device according to claim 3, wherein when reading the data, the reading control circuit simultaneously reads the data from the memory cells divided into different groups sharing the first lines or the second lines.

5. The nonvolatile semiconductor memory device according to claim 3, wherein when reading the data, the reading control circuit reads the data from the memory cells grouped into one group after reading the data from the memory cells grouped into the other group.

6. The nonvolatile semiconductor memory device according to claim 2, wherein when reading the data from the memory cells, the reading control circuit supplies the reading level voltage set in respective groups to one of the first lines and the second lines connected to memory cells to be read, and supplies an unselected level voltage set in respective groups to the other of the first lines and the second lines not connected to memory cells to be read.

7. The nonvolatile semiconductor memory device according to claim 3, wherein the reading control circuit comprises:
    a circuit for, when reading the data, alternately selecting the second lines in the stacked direction, applying a first voltage and a second voltage, which are different from each other, to the first lines of adjacent cell array layers in the stacked direction sharing the selected second lines respectively, and applying a third voltage to the selected second lines; and
    a sense amplifier circuit for simultaneously detecting currents flowing through the first lines respectively.

8. The nonvolatile semiconductor memory device according to claim 3, wherein the reading control circuit comprises:
    a circuit for, when reading the data, alternately selecting the second lines in the stacked direction, and alternately performing an application of a first voltage to the first lines of one of adjacent cell array layers in the stacked direction sharing the selected second lines and an application of a third voltage to the second lines, and an application of a second voltage different from the first voltage to the first lines of the other of the adjacent cell array layers and an application of a fourth voltage different from the third voltage to the second lines; and
    a sense amplifier circuit for alternately detecting currents respectively flowing through the first lines.

9. The nonvolatile semiconductor memory device according to claim 2, wherein the variable resistive device is transitable between a low resistance state and a high resistance state,
    a resistance value in the low resistance state of the variable resistive device belonging to a certain group is lower than a resistance value in the low resistance state of the variable resistive device belonging to other group, and
    the reading control circuit sets a reading level voltage of the certain group to be lower than a reading level voltage of the other group.

10. The nonvolatile semiconductor memory device according to claim 1, wherein the reading control circuit comprises a sense amplifier circuit for, when reading data from the memory cells, comparing a reference current set in respective groups with a cell current flowing through the memory cells.

11. A nonvolatile semiconductor memory device comprising:
    a three-dimensional cell array block in which a plurality of cell array layers are stacked, each of the cell array layers including a plurality of first lines, a plurality of second lines configured to intersect the first lines, and a plurality of memory cells disposed at each of intersections of the first and second lines and each including a variable resistance element configured to store an electrically rewritable resistance value as data in a nonvolatile manner; and a reading control circuit for supplying a reading level voltage set in respective cell array layers and reading data from the memory cells.

12. The nonvolatile semiconductor memory device according to claim 11 further including non-ohmic devices, wherein the three-dimensional cell array block is formed such that one of the first lines and the second lines are shared and forward bias directions of the non-ohmic devices are reversed between adjacent cell array layers in the stacked layer, and the reading control circuit supplies the reading level voltages which are different from each other to the others of the first lines and the second lines of the adjacent cell array layers in the stacked direction respectively.

13. The nonvolatile semiconductor memory device according to claim 12, wherein when reading the data, the reading control circuit simultaneously applies the reading level voltages which are different from each other to the other of the first lines and the second lines.

14. The nonvolatile semiconductor memory device according to claim 12, wherein when reading the data, the reading control circuit applies the reading level voltages which are different from each other to the other of the first lines and the second lines at a different timing, and applies different voltages to the one of the first lines and the second lines shared between adjacent cell array layers in the stacked direction at the different timing.

15. A nonvolatile semiconductor memory device comprising:

a three-dimensional cell array block in which a plurality of cell array layers are stacked, each of the cell array layers including a plurality of first lines, a plurality of second lines configured to intersect the first lines, and a plurality of memory cells disposed at each of intersections of the first and second lines and each including a non-ohmic device a variable resistance element configured to store an electrically rewritable resistance value as data in a nonvolatile manner, the three-dimensional cell array block being formed such that the first lines or the second lines are shared and forward bias directions of the non-ohmic devices are reversed between adjacent cell array layers in the stacked direction; and a reading control circuit for supplying a reading level voltage set in respective groups to the first lines or the second lines, and reading data from plurality of memory cells having the common forward bias direction of the non-ohmic devices as the same group.

16. The nonvolatile semiconductor memory device according to claim 15, wherein when reading the data, the reading control circuit simultaneously reads the data from the memory cells divided into different groups sharing the first lines or the second lines.

17. The nonvolatile semiconductor memory device according to claim 15, wherein when reading the data, the reading control circuit reads the data from the memory cells grouped into one group after reading the data from the memory cells grouped into the other group.

18. The nonvolatile semiconductor memory device according to claim 15, wherein the reading control circuit comprises:

a circuit for, when reading the data, alternately selecting the second lines in the stacked direction, applying a first voltage and a second voltage, which are different from each other, to the first lines of adjacent cell array layers in the stacked direction sharing the selected second lines, and applying a third voltage to the selected second lines; and a sense amplifier circuit for simultaneously detecting currents respectively flowing through the first lines.

19. The nonvolatile semiconductor memory device according to claim 15, wherein the reading control circuit comprises:

a circuit for, when reading the data, alternately selecting the second lines in the stacked direction, and alternately performing an application of a first voltage to the first lines of one of adjacent cell array layers in the stacked direction sharing the selected second lines and an application of a third voltage to the second lines, and an application of a second voltage different from the first voltage to the first lines of the other of the adjacent cell array layers and an application of a fourth voltage different from the third voltage to the second lines; and a sense amplifier circuit for alternately detecting currents respectively flowing through the first lines.

20. The nonvolatile semiconductor memory device according to claim 15, wherein the reading control circuit comprises a sense amplifier circuit for, when reading data from the memory cells, comparing a reference current set in respective groups with a cell current flowing through the memory cells.

* * * * *